United States Patent
Cranford, Jr. et al.

(10) Patent No.: US 7,286,947 B1
(45) Date of Patent: Oct. 23, 2007

(54) METHOD AND APPARATUS FOR DETERMINING JITTER AND PULSE WIDTH FROM CLOCK SIGNAL COMPARISONS

(75) Inventors: Hayden C. Cranford, Jr., Cary, NC (US); Fadi H. Gebara, Austin, TX (US); Jeremy D. Schaub, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/279,651

(22) Filed: Apr. 13, 2006

(51) Int. Cl.
*G06F 19/00* (2006.01)

(52) U.S. Cl. .................. 702/69; 702/106; 375/226; 370/503; 331/2; 331/11

(58) Field of Classification Search .............. 702/69, 702/106; 375/224, 376, 373, 355, 225, 356, 375/238, 226; 331/2, 11; 370/503
See application file for complete search history.

(56) References Cited

U.S. PATENT DOCUMENTS

| | | | |
|---|---|---|---|
| 5,889,435 A | 3/1999 | Smith et al. | |
| 6,208,169 B1 * | 3/2001 | Wong et al. | .................. 326/93 |
| 6,295,315 B1 | 9/2001 | Frisch et al. | |
| 6,366,631 B1 | 4/2002 | Nakayama et al. | |
| 6,522,122 B2 | 2/2003 | Watanabe et al. | |
| 6,640,103 B1 | 10/2003 | Inman et al. | |
| 6,661,836 B1 * | 12/2003 | Dalal et al. | .................. 375/226 |
| 6,728,311 B1 | 4/2004 | Waschura et al. | |
| 6,785,622 B2 | 8/2004 | Nygaard, Jr. | |
| 6,836,738 B2 | 12/2004 | Sepp et al. | |

(Continued)

OTHER PUBLICATIONS

U.S. Appl. No. 11/279,651, filed Apr. 13, 2006, Cranford, Jr. et al.

(Continued)

*Primary Examiner*—Carol S. W. Tsai
(74) *Attorney, Agent, or Firm*—Mitch Harris, Atty at Law, LLC; Andrew M. Harris; Casimer K. Salys (57) ABSTRACT

A method and apparatus for determining jitter and pulse width from clock signal comparisons provides a low cost and production-integrable mechanism for measuring a clock signal with a reference clock, both of unknown frequency. The measured clock signal is sampled at transitions of a reference clock and the sampled values are collected in a histogram according to a folding of the samples around a timebase which is either swept to detect a minimum jitter for the folded data or is obtained from direct frequency analysis for the sample set. The histogram for the correct estimated period is statistically analyzed to yield the pulse width, which is the difference between the peaks of the probability density function and jitter, which corresponds to width of the density function peaks. Frequency drift is corrected by adjusting the timebase used to fold the data across the sample set.

17 Claims, 10 Drawing Sheets

U.S. PATENT DOCUMENTS

| | | |
|---|---|---|
| 6,841,985 B1 | 1/2005 | Fetzer |
| 6,871,152 B2 | 3/2005 | Nygaard, Jr. |
| 6,934,648 B2 | 8/2005 | Hanai et al. |
| 7,158,899 B2 * | 1/2007 | Sunter et al. ................. 702/69 |
| 2002/0103609 A1 | 8/2002 | Kuyel |
| 2002/0118738 A1 | 8/2002 | Whitlock |
| 2003/0108137 A1 | 6/2003 | Li et al. |
| 2004/0143406 A1 | 7/2004 | Nishikobara et al. |
| 2005/0036578 A1 | 2/2005 | Heidel et al. |
| 2005/0069031 A1 * | 3/2005 | Sunter et al. ............... 375/224 |
| 2005/0107970 A1 | 5/2005 | Franch et al. |
| 2005/0286627 A1 * | 12/2005 | Tabatabaei .................. 375/238 |

OTHER PUBLICATIONS

Xia, et al., "Self-Refereed on-chip Jitter Measurement Circuit Using Vernier Oscillators", Proceedings of the IEEE Computer Society Annual Symposium on VLSI, IEEE, 2005, US.

Ong, et al. "A Scalable On-Chip Jitter Extraction Technique" Proceedings of the IEEE VLSI Test Symposium 2004, IEEE, 2004, US.

Larsson, et al. "Measuring high-bandwidth signals in CMOS circuits", Electronics Letters, vol. 29, No. 30, Sep. 1993, IEE.

Ho, et al., "Applications of On-Chip Samplers for Test and Measurement of Integrated Circuits", 1998 VLSI Symposium, IEEE, 1998.

Takamiya, et al., "An On-chip 100GHz-Sampling Rate 8-channel Sampling Oscilloscope with Embedded Sampling Clock Generator", 2002 ISSCC.

Abaskharoun, et al., "Strategies for On-chip Sub-nanosecond Signal Capture and Timing Measurements", IEEE, 2001, US.

Ong, et al. "Jitter Spectral Extraction for Multi-gigahertz Signal", (DAC) IEEE, 2004, US.

Jenkins, et al.,"An On-Chip Jitter Measurement Circuit with Sub-picosecond Resolution", Proceedings of ESSCIRC, Grenoble, France, Jan. 2005.

Restle, et al., "Timing Uncertainty Measurements on the Power5 Microprocessor", IEEE 2004 Solid-State Circuits Conference, Jun. 2004.

* cited by examiner

METHOD AND APPARATUS FOR DETERMINING JITTER AND PULSE WIDTH FROM CLOCK SIGNAL COMPARISONS

This invention was made with Government support under NBCH3039004, DARPA. THE GOVERNMENT HAS CERTAIN RIGHTS IN THIS INVENTION.

BACKGROUND OF THE INVENTION

1. Technical Field:

The present invention relates generally to digital clock circuits, and more particularly, to circuits and systems that evaluate clock jitter and duty cycle.

2. Description of the Related Art:

Determining nominal pulse width and jitter of a clock signal is necessary to evaluate the performance of high-speed interface components and interfaces, as well as other circuits having high-frequency clocks. Determining nominal pulse width and jitter of a clock signal is also desirable in many circuits that determine the quality of a received or generated clock and/or circuits that adapt performance in order to accommodate a level of jitter and/or pulse width deviations in a clock signal.

In laboratory environments, high-accuracy laboratory instruments may be used to determine the jitter and/or pulse width of a clock signal via very stable reference clocks and long integration times. However, the challenge of probing a very high frequency clock and/or high-impedance signal is significant, as the effects of the probe must be accounted for in the measurements and probe characteristics can vary over time and the probe compensation model may not be accurate under actual measurement conditions. Further, significant circuit area can be consumed in the impedance-matched and isolated output pads that permit such precision measurements. Such equipment is expensive and it is typically unfeasible to incorporate the equivalent of such instrumentation within production circuits.

Typically, in on-chip measurements a jitter and/or pulse width measurement is performed using a synchronous clock that is generated locally in phase-lock or with a high degree of frequency accuracy with the clock signal being measured. Thus the exact frequency of the clock signal being measured must be known. Alternatively, the amplitude of error or feedback signals of a phase-lock loop (PLL) circuit locked to a clock may be observed to determine the amount of jitter present in a clock signal. Some PLL techniques employ an adjustable delay line that provides for measuring the distribution of clock edge position, but requires a complex circuit and stable reference clock. Clock pulse width may also be determined from an average DC signal level of the clock, but generally not with high accuracy due to low-frequency noise. However, achieving accuracy with any of the above-described PLL techniques when applied to a high-frequency clock typically require a PLL circuit just as costly as the clock source itself and with an inherent stability that is at least an order of magnitude greater.

It is therefore desirable to provide a method and apparatus for determining jitter and pulse width of a clock signal that is low cost, can be at least partially integrated in a production circuit with no probing error and can quickly determine the jitter and pulse width of a clock signal of unknown frequency.

SUMMARY OF THE INVENTION

The above-stated objectives of providing a low-cost apparatus and method for determining clock signal jitter and pulse width is provided in a method and apparatus.

The method analyzes raw data provided by the apparatus, and the performance of the method may be distributed between a test circuit and a workstation computer or may be completely embedded in a test instrument or production integrated circuit.

The method collects values of a clock signal under measurement by sampling the clock signal under measurement at transitions of a reference clock signal that differs at least slightly in frequency from the clock signal under measurement.

The sampled data is analyzed according to a guess of the relationship between the periods/frequencies of the sampling clock and the clock signal under measurement, and the guess is adjusted either over a range, or until an indication that the guess is correct is obtained, such as a jitter analysis indicating minimum jitter or a frequency-domain analysis indicating peak signal energy at particular frequency.

The period obtained above is used to generate a timebase to fold the sampled data. The frequency or period of neither clock signal needs to be known in order to further analyze the data, only the relationship between the two, as determined by the one of the methods described above. However, if the frequency of the reference clock signal is known to a sufficient degree of accuracy, then the frequency of the clock signal under measurement can be determined from the determined clock period.

The values of the clock signal samples are then analyzed in accordance with the folded data, in order to generate a histogram of sampled clock signal values on sub-intervals of the clock period. The values are placed into histogram "bins" that correspond to each sub-interval (slice) of the overall clock period. Once the histogram is generated, which corresponds to the cumulative distribution function of the clock signal values over one period, the histogram is then differentiated to obtain the probability density function, which yields a measure of the jitter. The difference between the two peaks of the probability density function is the nominal pulse width of the clock signal under measurement, and the width of the probability density function peaks indicates the amount of jitter present.

Drift between the frequency of the reference clock signal and the clock signal under measurement can be removed from the analysis results by using a linear or other shift model to progress the guessed period across the sample set, and the exact frequency drift can be identified from the histogram having the minimum widths of the peaks in the probability density function.

The sampling circuit can be included in a production die and the data collected by a workstation computer via direct probing or a boundary-scan data interface. Alternatively, a processing circuit or algorithm may be present or loaded into a production integrated circuit that includes a processor or a dedicated digital circuit use to conduct the above-described analysis. The analysis method may be embodied in a computer-program product containing stored program instructions for carrying out the steps of the method.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DESCRIPTION OF ILLUSTRATIVE EMBODIMENT

The present invention concerns the measurement of jitter and other characteristics such as duty cycle/pulse width of clock signals, and in particular, the measurement of characteristics of interface clocks. In order to produce accurate results, the capture of measurement data is generally performed by a sampling circuit within the interface (or other clock-receiving circuit) rather than a separate test probe. However, the techniques of the present invention can be applied to and within test equipment, as well.

Primarily, the present invention provides new methods for analyzing data obtained by sampling a clock signal under measurement with an asynchronous reference clock. Rather than filtering the sampled data, as is done within a phase-lock loop (PLL) loop filter, the present invention resolves the sampled data to identify a relationship between the measured clock signal relative to a reference clock and then determines the characteristics of the measured clock signal from the distribution of samples after folding the sampled data according to the identified clock relationship.

Therefore, the reference clock used to sample the clock signal under measurement and the measured clock itself must differ in frequency at least slightly and a sufficient number of samples must be collected so that jitter can be distinguished from data variation due to slight frequency differences. Neither of the clock periods/frequencies need be known in order to evaluate jitter and pulse width. However, if highly stable frequency source with known frequency is employed for the reference clock, then the frequency of the measured clock may be computed from the results of the analysis.

Figure 1:
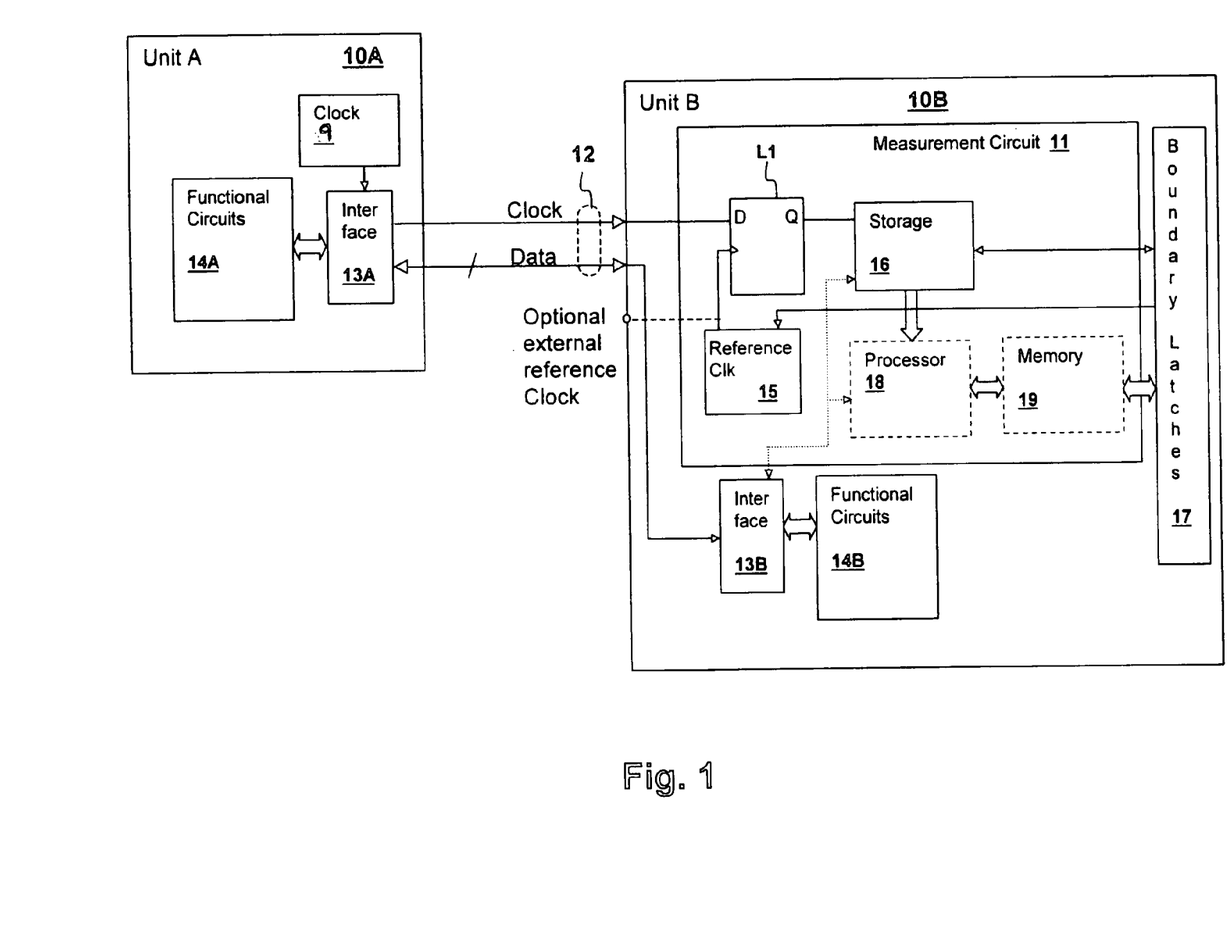
FIG. 1 is a block diagram of a first electronic unit connected by an interface to a second electronic interface in accordance with an embodiment of the invention.

With reference now to the figures, and in particular with reference to FIG. 1, there is depicted a block diagram of electrical units 10A and 10B connected by a wired interface or other channel 12 that includes a Clock signal and one or more Data signals. Interface circuits 13A, 13B may be located within a device such as a computer peripheral, a computer system, or within integrated circuits interconnected within a system or may be a wireless device interface having a clock signal embedded in a received signal. Clock 9 provides a clock input to interface circuit 13A. Functional circuits 14A, 14B do not generally form part of the present invention, but perform the functions associated with the normal operation of units 10A and 10B. Functional circuit 14B is included to illustrate that the techniques of the present invention can be applied to a functional device rather than a laboratory model. However, in some instances, the circuits required to perform the measurements of the present invention will already be present in functional circuits 14B of a particular electrical unit 10B without modification, and the use of such functional circuits to perform data collection as input to a method according to an embodiment the present invention are contemplated herein.

The circuit required for data collection is illustrated separately as a measurement circuit 11 and includes a sample latch L1, a reference clock 15 and a storage 16 for samples collected of interface 12 Clock signal at edges of reference clock 15. A processor 18 and memory 19 are optionally included for performing methods according to the present invention, or the raw data from storage 16 may be clocked out by a test system via boundary latches 17 or otherwise read from unit 10B via interface 13B, e.g., by electrical unit 10A as Sample Data over interface 12. Also, if processor 18 and memory 19 are included, and the sampled clock data is processed locally, interface 13B and/or analysis performed by a method according to the present invention.

Some degree of tuning of reference clock 15 must generally be provided, or reference clock 15 frequency must be chosen so that the frequency that will not land on an exact multiple of the clock frequency of the measured clock signal, thus generating a zero beat frequency that will yield a single nominal (DC) value in the folded data. Reference clock 15 is therefore shown coupled to boundary latches 17 in order to provide to least a single bit adjustment that can change the clock frequency of reference clock 15 if needed to avoid sampling too close to the frequency of the clock under measurement. Reference clock 15 may also be optionally provided from an external source such as a test system, especially if a frequency measurement of the measured clock signal is also desired.

Figure 2:
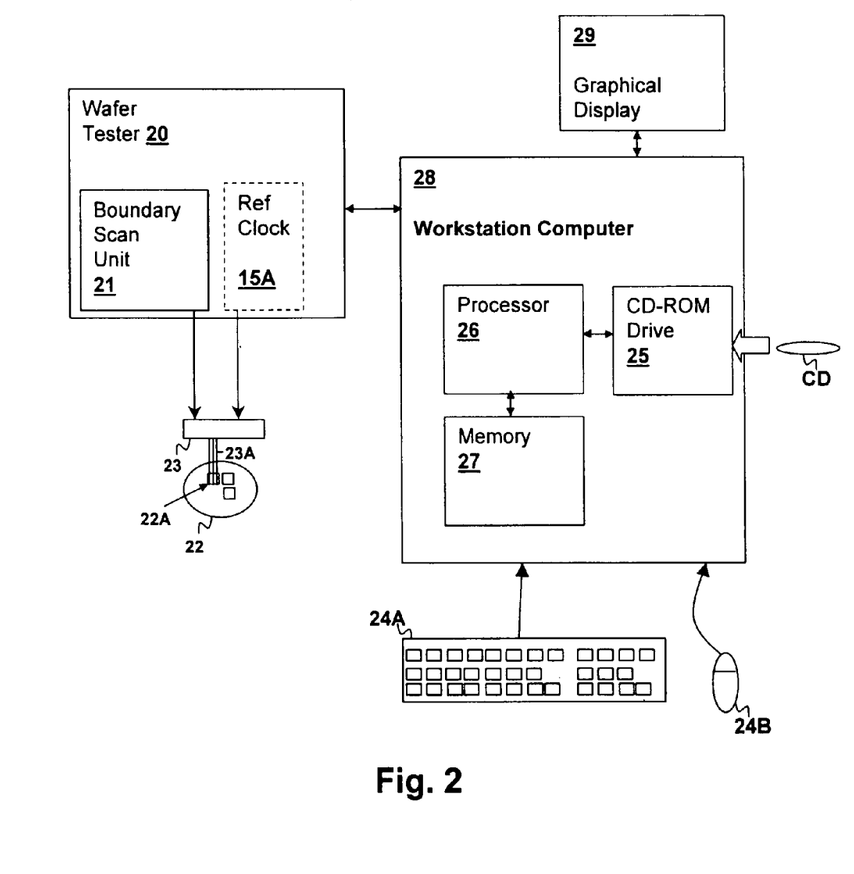
FIG. 2 is a pictorial diagram of a manufacturing tester and workstation computer connected to a device under measurement implementing a method in accordance with an embodiment of the present invention.

Referring now to FIG. 2, a wafer test system, in which methods according to an embodiment of the present invention are performed, is depicted. A wafer tester 20 includes a boundary scan unit 21 for providing stimulus to and reading data from a die 22A on a wafer under test 22, via a probe head 23 having electrical test connections 23A to die 22A. An optional reference clock 15A is included for optionally providing a stable and accurate clock to the above-described sampling circuits within die 22A, to either improve the measurement results, or to provide additional measurement of the frequency of the measured clock signal.

A workstation computer 28, having a processor 26 coupled to a memory 27, for executing program instructions from memory 27, wherein the program instructions include program instructions for executing one or more methods in accordance with an embodiment of the present invention, is coupled to wafer tester 20, whereby the sampled clock data (or analysis results from processor 18 and memory 19 of FIG. 1) can be retrieved. A CD-ROM drive 25 is also coupled to processor 26 for transfer of program products from media such as CD-ROM CD that contain program instructions for executing methods in accordance with embodiments of the present invention.

Workstation computer 28 is also coupled to a graphical display 29 for displaying program output such as the jitter and pulse width values computed by embodiments of the present invention, as well as graphical data such as the graphs depicted in FIGS. 4A-7D and described below. Workstation computer 28 is further coupled to input devices such as a mouse 24B and a keyboard 24A for receiving user input. Workstation computer may be coupled to a public network such as the Internet, or may be a private network such as the various "intra-nets" and software containing program instructions embodying methods in accordance with embodiments of the present invention may be located on remote computers or locally within workstation computer 28. Further, workstation computer 28 may be coupled to wafer tester 20 by such a network connection.

While the system of FIG. 2 depicts a configuration suitable for sequential test of a plurality of dies on a wafer, the depicted system is illustrative and not limiting to the present invention. Probe head 23 may be a multi-die full wafer probe system, or may comprise multiple probe heads for simultaneously testing multiple wafers on a single or multiple die basis. Additionally, while boundary scan data retrieval is illustrated, the techniques of the present invention may also be applied to a data interface including the loading of program code to memory 19 (FIG. 1) for execution by processor 18 (FIG. 1) incorporated on die 22A to an interface other than boundary scan unit 21, for example, via a dedicated test interface device that retrieves sampled clock data from storage 16 (FIG. 1) or test results from memory 19.

Figure 3:
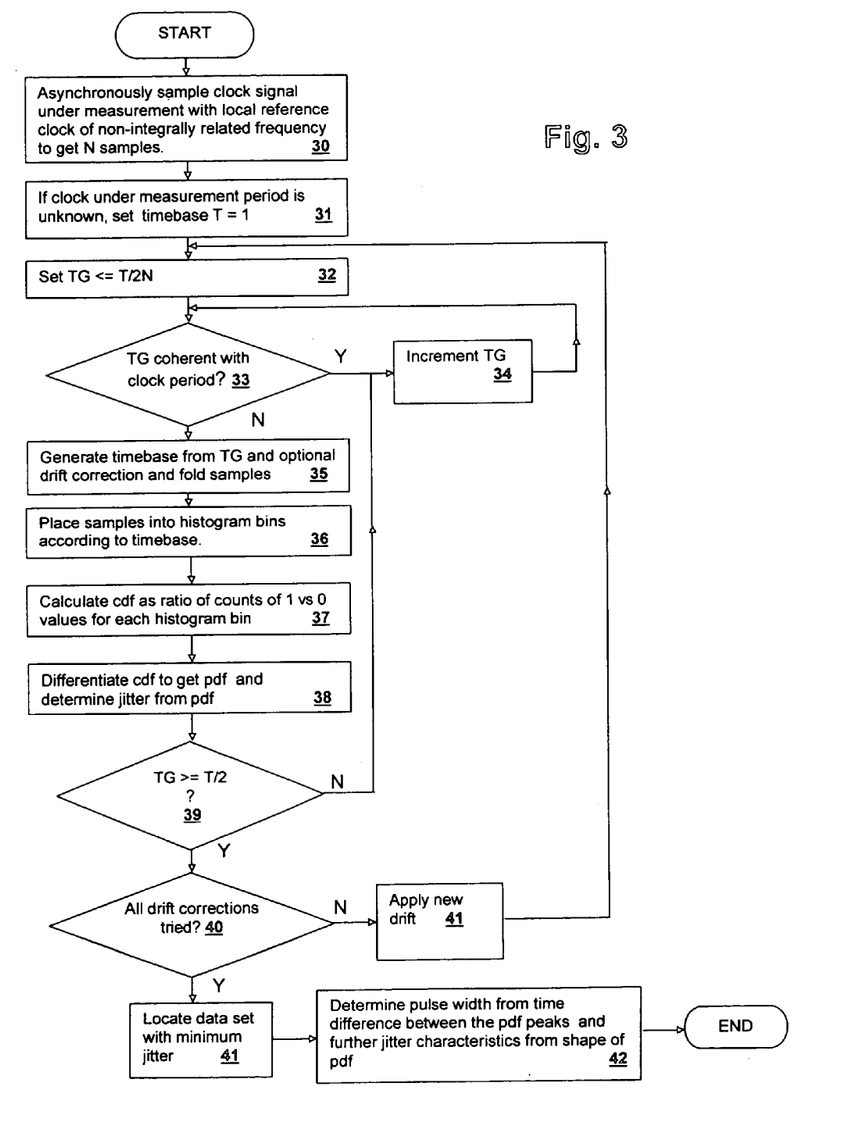
FIG. 3 is a flowchart illustrating a method in accordance with an embodiment of the invention.

Referring now to FIG. 3, a method according to an embodiment of the present invention is illustrated in a flowchart. The clock signal under measurement is sampled with a local reference clock of non-integrally related frequency (step 30) to obtain N samples. If the period of the clock signal under measurement is known, then T is set to that period, otherwise T is set to 1 (step 31). Next, an initial guess of the sampling clock period TG is made as a number <=T/2N (step 32). A coherency check is made on the relationship between T and TG to reject clock period guesses that are closely related, e.g. TG={T/2, T/3, T/4, T/5, 2T/5} (decision 33) and if the coherency check fails, TG is incremented (step 34). Next, a timebase is generated from TG and an optional drift correction is applied and the samples are folded to a unit interval using the optionally drift-corrected timebase (step 35). The samples are then binned into histogram bins according to the sub-intervals indicated by the timebase (step 36) and the cumulative distribution function (cdf) computed by the ratio of counts the two logical values "1" and "0" of the samples in each bin (step 37). The cdf is then differentiated to obtain the probability density function (pdf) and the jitter determined by the shape of the pdf (step 38).

The above-described steps from decision 33 to step 38 are repeated for all increments of TG up to T/2 (decision 39). Also, until all desired drift corrections are applied (decision 40), new drift corrections are applied (step 41) and step 32 through decision 39 are repeated. After the data values have been analyzed over all timebase periods and drift corrections, the TG period for which the minimum jitter is present (step 41) is taken as the correct clock period and the pulse width is determined from the time difference between the peaks in the pdf and further jitter characteristics are determined from the shape of the pdf (step 42).

At one particular TG value, the jitter value will drop dramatically, with two sharp peaks in the pdf indicating that TG is at the correct value per step 41. Even a small deviation in period from the actual period of the sampling clock will result in an essentially equal distribution of values across the bins if a sufficient number of values are collected, and thus a high jitter value for the clock signal under measurement.

Figure 4A:
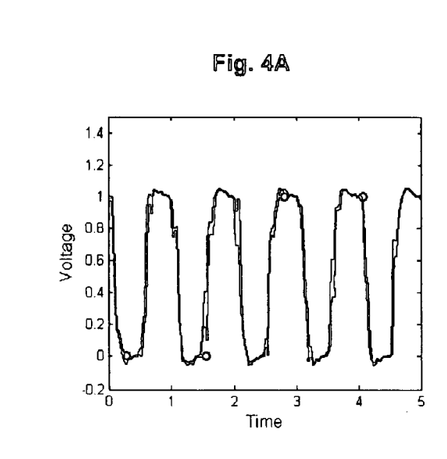
FIGS. 4A-4E are graphs depicting data processing operations and measurements in a method according to an embodiment of the present invention.
Figure 4B:
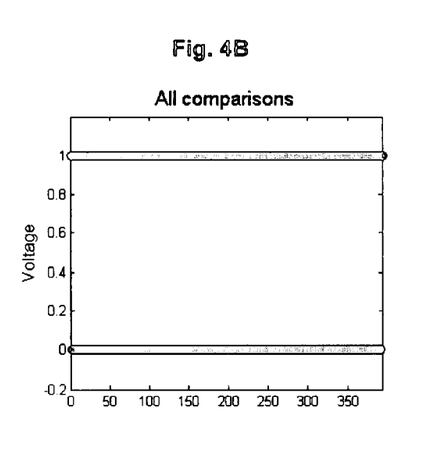
Figure 4C:
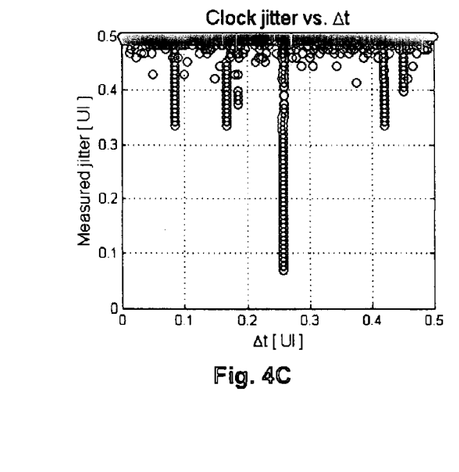
Figure 4D:
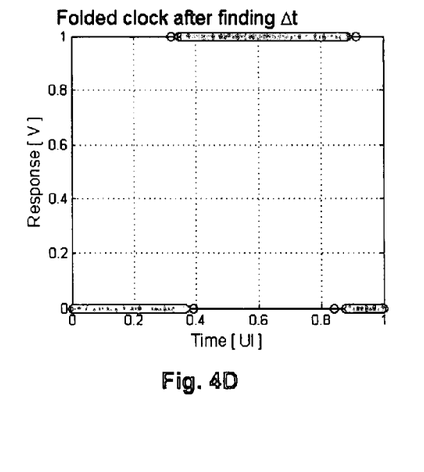

Referring now to FIGS. 4A-4D, the graphs depicted illustrate the method described above with respect to FIG. 3. FIG. 4A shows the samples (circles) obtained from the clock signal under measurement. FIG. 4B shows the distribution of accumulated sample values (corresponding 1V and 0V) prior to folding. FIG. 4C shows a graph of estimated jitter vs. sampling clock period. The sharp drop in jitter at period ?t=0.265 indicates the correct reference clock period. FIG. 4D shows the distribution of values in the folded clock after finding the correct period. The overlapping regions correspond to regions of transition cause by the jitter. The period in the graphs is expressed as the modulo remainder of TG/T, which provides a unit interval of reference for the folded data.

Figure 4E:
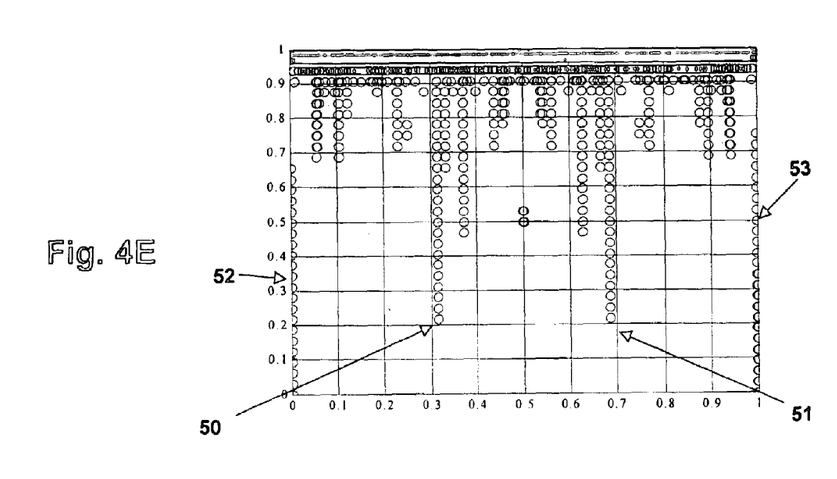

Referring now to FIG. 4E a graph of jitter versus sampling clock period is shown across the unit interval from a zero modulus period 52 corresponding to a zero difference in periods between the clock signal under measurement and the reference clock, to a period 53 that indicates a difference in clock periods corresponding to one clock being twice the frequency of the other. (The 1.0 and 0 values are essentially the same point on the unit interval since mod [2T/T]=0.)

The very low jitter values at periods 52 and 53 are due to the DC value yielded from the sample set being read at effective identical positions within the waveform of the clock under measurement, i.e. coherent sampling, which is rejected by the above-described method in step 33 of FIG. 3. Periods 50 and 51 are the correct estimated periods, having the minimum amount of actual jitter and correspond to modulus of the ratio between the measured clock and reference clock periods. As can be observed from the figure, the graph is symmetrical around T/2, so the estimated period only needs to be swept over half of the unit interval. The other drops in jitter value correspond to products of harmonic relationships of higher order between the guessed period, the reference clock and the measured clock.

Figure 5:
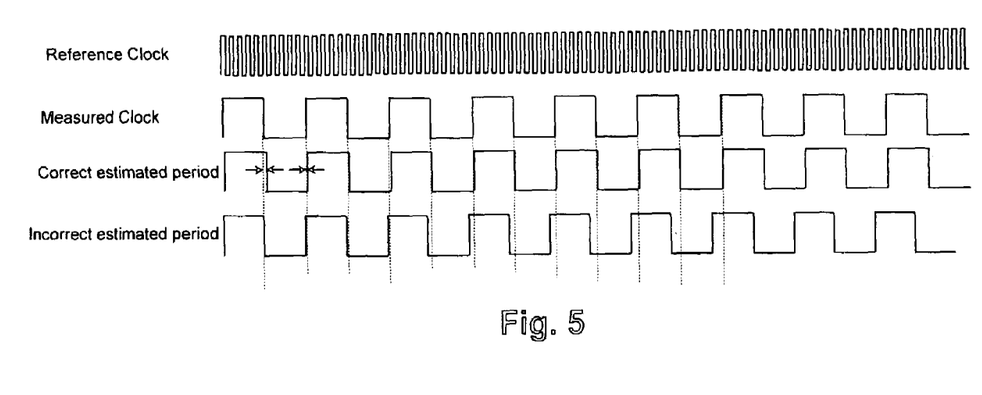
FIG. 5 is a pictorial diagram illustrating a method of determining estimated clock periods in accordance with an embodiment of the invention.

Referring now to FIG. 5, a pictorial diagram illustrating the folding technique is shown. The illustration is a simplified diagram that illustrates a Reference Clock signal providing an oversampling factor of 10, where in actuality the measured clock may not be oversampled and might be undersampled. The Measured Clock signal is the actual measured clock waveform and the waveforms beneath, though drawn as continuous waveforms, present samples in the data set provided by sampling the Measured Clock signal with the Reference Clock signal and selecting specific samples from the data set to "reconstruct" the edges of the Measured Clock signal. In the Correct Estimated Period signal, the samples are chosen according to a period that corresponds to the correct relationship between the Measured Clock signal period and the Reference Clock signal period, and therefore only jitter and pulse width deviations will cause differences between the expected position of an edge and the actual position of the edge in the data set (illustrated by the arrows). For the Incorrect estimated period signal illustrated, the progressive (and cyclic) edge differences will yield a "jitter" distribution that is uniform for large enough sample sets, as the distance between the expected edge locations and the actual edge locations cycle through a full range of phase differences. Therefore, the minimum jitter distribution will occur when the guessed period is equal to the correct sampling clock period.

Figure 6A:
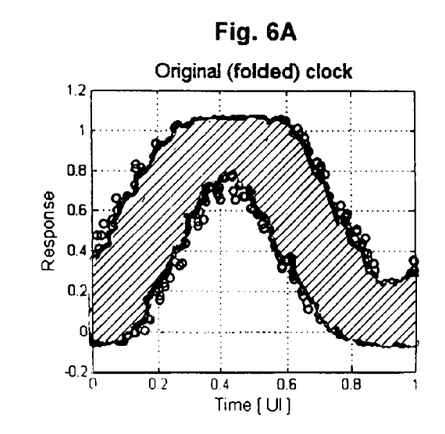
FIGS. 6A-6D are graphs depicting further data processing operations and measurements in a method according to an embodiment of the present invention.
Figure 6B:
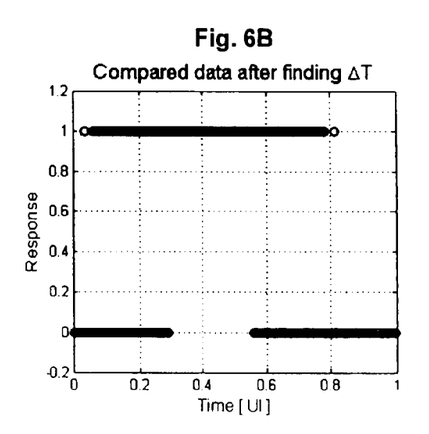
Figure 6C:
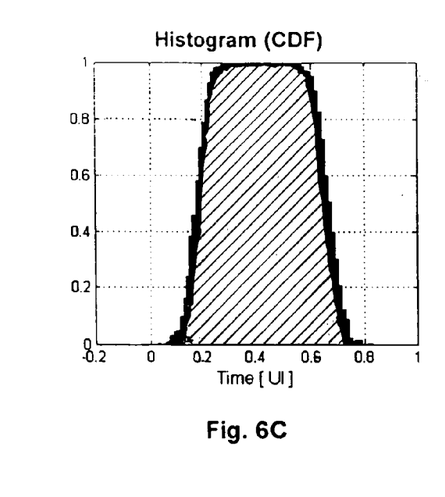
Figure 6D:
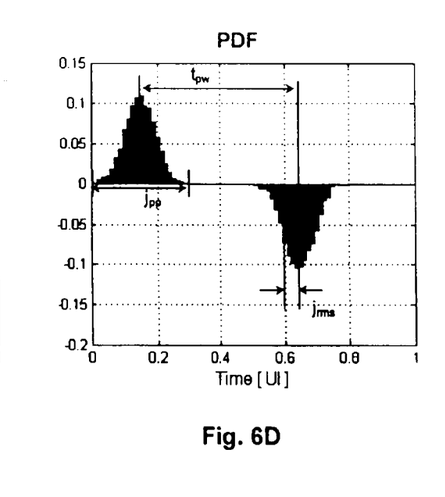

Referring now to FIG. 6A, the values of the clock signal are shown with respect to the folded data, although such data are not computed from the method described herein unless voltage level sampling is also included via another mechanism. The figure is useful for illustrating how the actual clock signal resembles the folded sample data depicted in FIG. 6B. The histogram of sample value distribution is shown in FIG. 6C, corresponding to a ration of a number of "1" samples to "0" samples in each bin, where "1" is the logical high state of the clock signal and "0" is the logical low state. Transition regions are present where the histogram is not equal to 1.0 or 0.0. FIG. 6D shows the pdf computed by differentiating the cdf histogram of FIG. 6C. The difference between the mean value of each of the two distributions in the pdf is $t_{pw}$, the "1" level pulse width of the clock signal. The width of the distributions is the peak-to-peak jitter for each edge (only one is illustrated as $j_{pp}$) and the deviation of each distribution can be used to compute the rms jitter $j_{rms}$ of each edge of the clock signal.

Figure 7A:
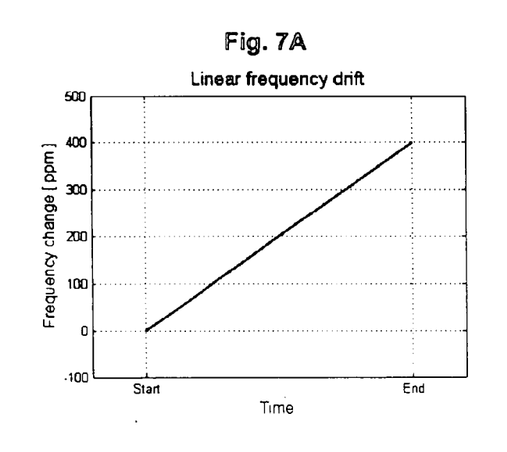
FIGS. 7A-7D are graphs depicting operations in correcting frequency drift in a method according to an embodiment of the present invention.
Figure 7B:
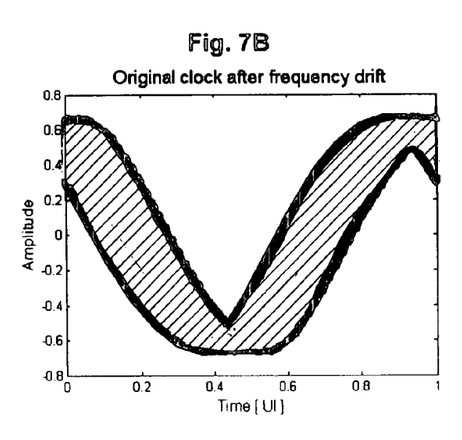
Figure 7C:
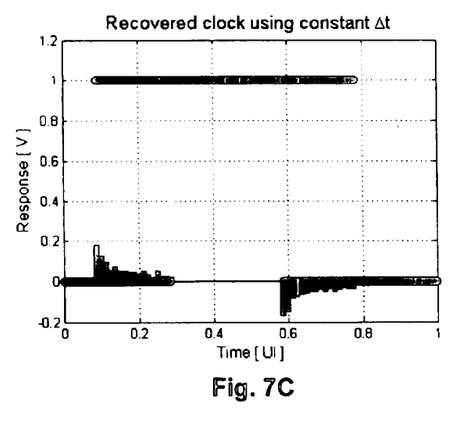
Figure 7D:
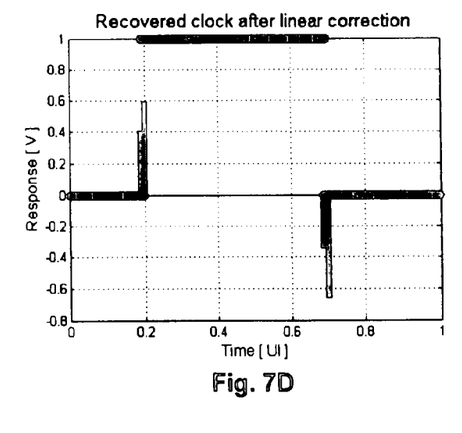

FIGS. 7A-7D illustrate the application of a frequency drift correction function in the methods of the present invention. FIG. 7A depicts an optional drift correction function used to increase or decrease the guessed period progressively over the sample set during the method described above. FIG. 7B illustrates the application of the drift correction to the actual folded clock signal (again not an actual computation in the method above unless voltage level samples are obtained and folded). FIG. 7C illustrates the distribution of the clock signal samples without drift correction. The jitter is asymmetrically distributed with more jitter points near the earlier portion of each distribution and the overall distribution of jitter values is wider. FIG. 7D shows the distribution of clock signal samples after the proper drift correction has been applied.

Figure 8A:
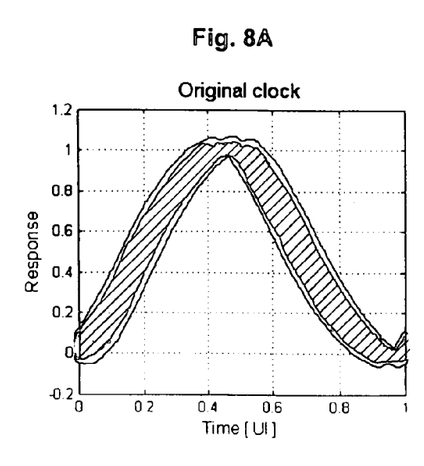
FIGS. 8A-8D are graphs depicting operation of a method according to an embodiment of the present invention in the presence of sinusoidal jitter.
Figure 8B:
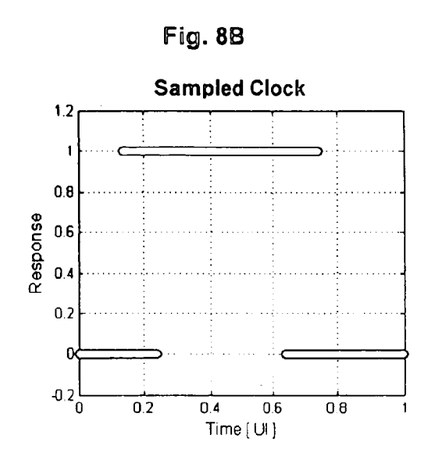
Figure 8C:
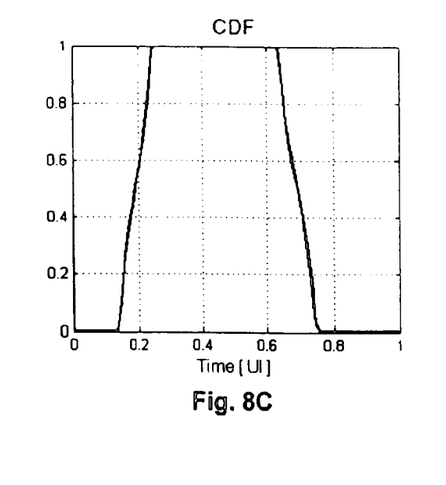
Figure 8D:
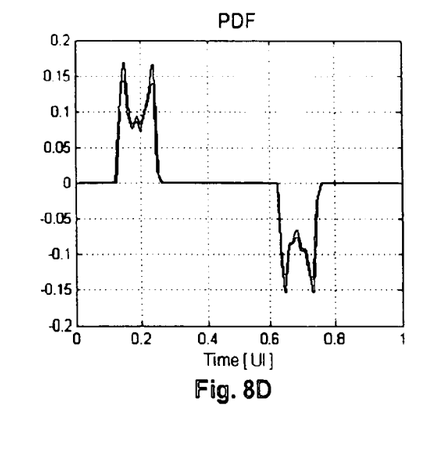

FIGS. 8A-8D illustrates how the method can be further applied to identify jitter characteristics and the effect of type of jitter on the computed distributions. FIG. 8A shows a clock signal with sinusoidal jitter. FIG. 8B shows a corresponding folded set of sample values. FIG. 8C shows the corresponding cdf and FIG. 8D the corresponding pdf, showing that the jitter is not random, as the peaks are not Gaussian-shaped, but have a "preference" for two particular sub-regions. Such results can be further observed to find jitter-inducing mechanisms and chaotic circuit behaviors that shape jitter.

Figure 9:
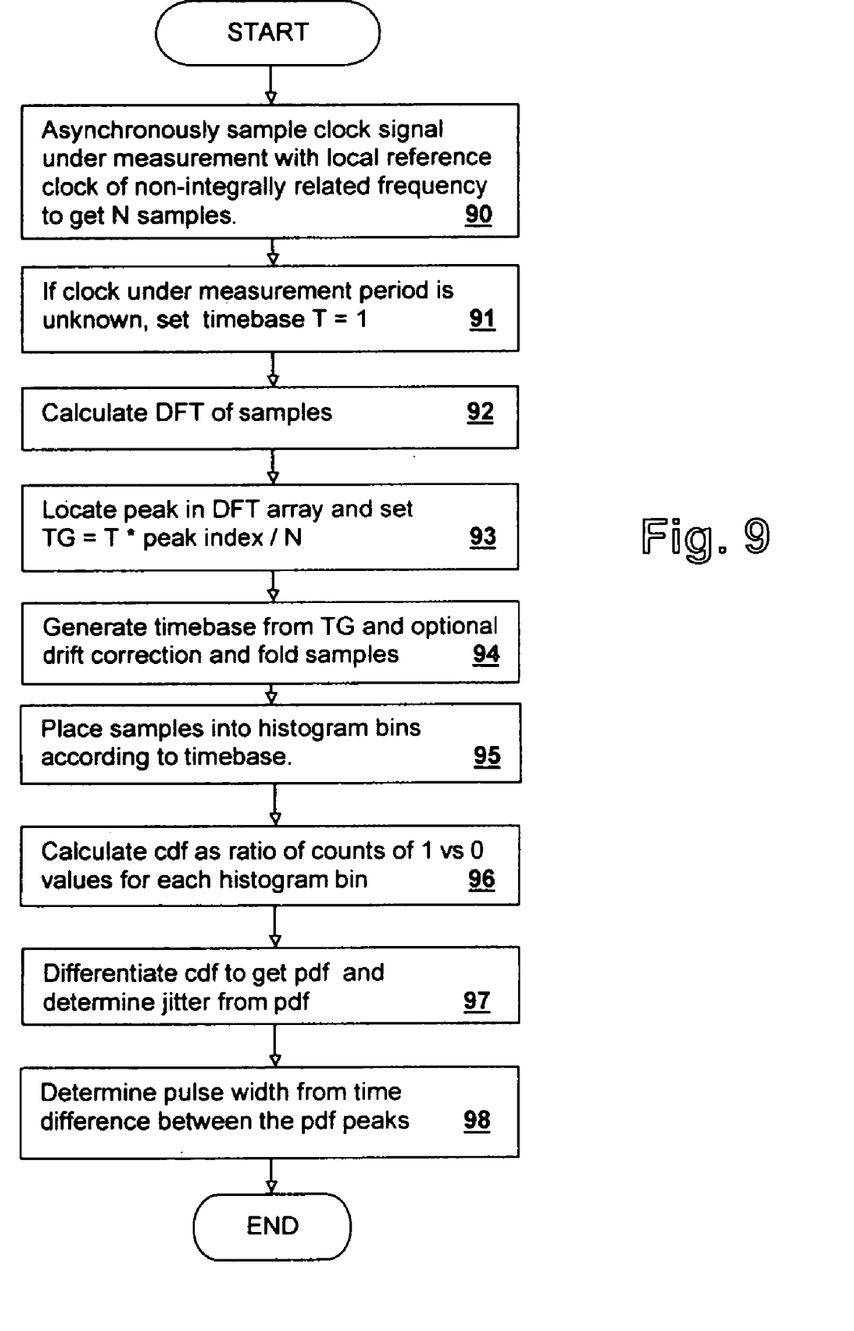
FIG. 9 is a flowchart illustrating a method in accordance with another embodiment of the invention.
Figure 10:
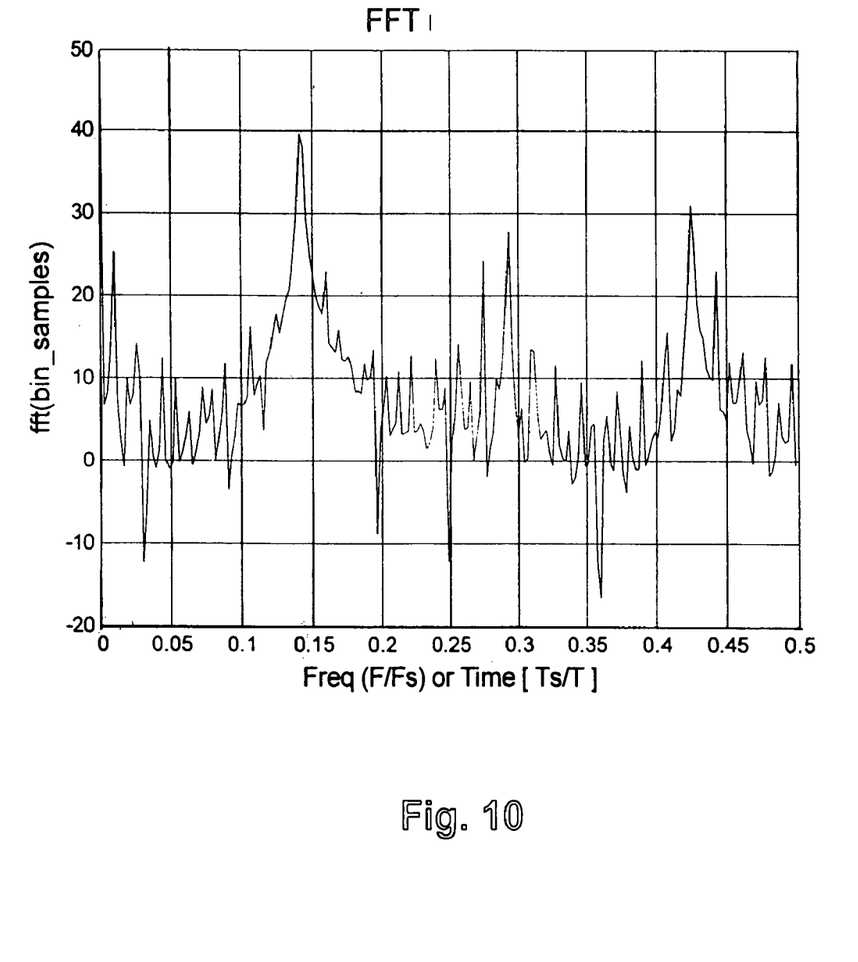
FIG. 10 is a graph depicting a result of the DFT analysis of step 92 of the method of FIG. 9.

FIG. 9 depicts a method in accordance with an alternative embodiment of the invention. Rather than performing jitter analysis while sweeping a guessed period TG, the method of FIG. 9 pre-analyzes the sample set to determined TG directly. First, as in the method of FIG. 3, the clock signal under measurement is sampled with a local reference clock of non-integrally related frequency (step 90) to obtain N samples. If the period of the clock signal under measurement is known, then T is set to that period, otherwise T is set to 1 (step 91). Next, a Discrete Fourier Transform (DFT) is performed on the sample set (step 92) and the peak value is located within the DFT result (step 93), which is taken as TG by dividing the T times the index of the peak divided by the number of samples. Next, a timebase is generated from TG and an optional drift correction is applied and the samples are folded to a unit interval using the optionally drift-corrected timebase (step 94). The samples are then binned into histogram bins according to the sub-intervals indicated by the timebase (step 95) and the cumulative distribution function (cdf) computed by the ratio of counts the two logical values "1" and "0" of the samples in each bin (step 96). The cdf is then differentiated to obtain the probability density function (pdf) and the jitter determined by the shape of the pdf (step 97). As in the method of FIG. 3, peak-to-peak jitter can be determined from the width of the peaks in the pdf, and the rms jitter can be computed from the deviation of the pdf peaks. Then the pulse width is determined from the time difference between the peaks in the pdf (step 98).

While the invention has been particularly shown and described with reference to the preferred embodiment thereof, it will be understood by those skilled in the art that the foregoing and other changes in form, and details may be made therein without departing from the spirit and scope of the invention.

What is claimed is:

1. A method of measuring a pulse width of a clock signal under measurement, comprising:
    collecting samples of values of said clock signal under measurement at regular intervals having a sampling period differing from said actual clock period of said clock signal or a multiple thereof;
    determining a timebase period corresponding to a relationship between said sampling period and said actual clock period;
    grouping said values according to said timebase into bins of a histogram corresponding to sub-intervals of said actual clock period; and
    analyzing said histogram to determine said pulse width of said clock signal by determining peaks of both distributions of said values in said histogram in regions of transition of said clock signal, and computing said pulse width from a difference between said peaks.

2. The method of claim 1, wherein said determining said timebase period comprises:
    computing an indication of an amount of effective jitter of said clock signal for said estimated period; and
    adjusting said timebase period until a timebase period yielding a minimum amount of said effective jitter is found.

3. The method of claim 1, wherein said determining said timebase period comprises:
    performing a frequency-domain analysis of said values; and
    locating a peak in a result of said frequency-domain analysis.

4. The method of claim 1, further comprising changing said timebase period across said samples during said grouping to correct for drift in at least one of a width of said regular intervals and said actual clock period.

5. A workstation computer system comprising a processor for executing program instructions coupled to a memory for storing program instructions and data, wherein said program instructions comprise program instructions for measuring a pulse width of a clock signal under measurement, said program instructions comprising program instructions for:
    collecting samples of values of said clock signal under measurement at regular intervals having a sampling period differing from said actual clock period of said clock signal or a multiple thereof;

determining a timebase period corresponding to a relationship between said sampling period and said actual clock period;

grouping said values according to said timebase into bins of a histogram corresponding to sub-intervals of said actual clock period; and analyzing said histogram to determine said pulse width of said clock signal by determining peaks of both distributions of said values in said histogram in regions of transition of said clock signal, and computing said pulse width from a difference between said peaks.

6. The workstation computer system of claim 5, wherein said program instructions for determining said timebase period comprise program instructions for:

computing an indication of an amount of effective jitter of said clock signal for said estimated period; and adjusting said timebase period until a timebase period yielding a minimum amount of said effective jitter is found.

7. The workstation computer system of claim 5, wherein said program instructions for determining said timebase period comprise program instructions for:

performing a frequency-domain analysis of said values; and locating a peak in a result of said frequency-domain analysis.

8. The workstation computer system of claim 5, wherein said program instructions further comprise program instructions for changing said timebase period across said samples during said grouping to correct for drift in at least one of a width of said regular intervals and said actual clock period.

9. A computer program product comprising signal-bearing media encoding program instructions for execution within a computer system, wherein said program instructions comprise program instructions for measuring a pulse width of a clock signal under measurement, said program instructions comprising program instructions for:

collecting samples of values of said clock signal under measurement at regular intervals having a sampling period differing from said actual clock period of said clock signal or a multiple thereof;

determining a timebase period corresponding to a relationship between said sampling period and said actual clock period;

grouping said values according to said timebase into bins of a histogram corresponding to sub-intervals of said actual clock period; and analyzing said histogram to determine said pulse width of said clock signal by determining peaks of both distributions of said values in said histogram in regions of transition of said clock signal, and computing said pulse width from a difference between said peaks.

10. The computer program product of claim 9, wherein said program instructions for determining said timebase period comprise program instructions for:

computing an indication of an amount of effective jitter of said clock signal for said estimated period; and adjusting said timebase period until a timebase period yielding a minimum amount of said effective jitter is found.

11. The computer program product of claim 9, wherein said program instructions for determining said timebase period comprise program instructions for:

performing a frequency-domain analysis of said values; and locating a peak in a result of said frequency-domain analysis.

12. The computer program product of claim 9, wherein said program instructions further comprise program instructions for changing said estimated period across said samples during said grouping to correct for drift in at least one of a width of said regular intervals and said actual clock period.

13. A method of measuring a characteristic of a clock signal under measurement, comprising:

collecting samples of values of said clock signal under measurement at regular intervals having a sampling period differing from an actual clock period of said clock signal or a multiple thereof;

determining a timebase period corresponding to a relationship between said sampling period and said actual clock period by computing an indication of an amount of effective jitter of said clock signal for said estimated period, and adjusting said timebase period until a timebase period yielding a minimum amount of said effective jitter is found;

grouping said values according to said timebase into bins of a histogram corresponding to sub-intervals of said actual clock period; and analyzing said histogram to determine said characteristic.

14. A workstation computer system comprising a processor for executing program instructions coupled to a memory for storing program instructions and data, wherein said program instructions comprise program instructions for measuring a characteristic of a clock signal under measurement, said program instructions comprising program instructions for:

collecting samples of values of said clock signal under measurement at regular intervals having a sampling period differing from an actual clock period of said clock signal or a multiple thereof;

determining a timebase period corresponding to a relationship between said sampling period and said actual clock period by computing an indication of an amount of effective jitter of said clock signal for said estimated period, and adjusting said timebase period until a timebase period yielding a minimum amount of said effective jitter is found;

grouping said values according to said timebase into bins of a histogram corresponding to sub-intervals of said actual clock period; and analyzing said histogram to determine said characteristic of said clock signal.

15. A computer program product comprising signal-bearing media encoding program instructions for execution within a computer system, wherein said program instructions comprise program instructions for measuring a characteristic of a clock signal under measurement, said program instructions comprising program instructions for:

collecting samples of values of said clock signal under measurement at regular intervals having a sampling period differing from an actual clock period of said clock signal or a multiple thereof;

determining a timebase period corresponding to a relationship between said sampling period and said actual clock period by computing an indication of an amount of effective jitter of said clock signal for said estimated period, and adjusting said timebase period until a timebase period yielding a minimum amount of said effective jitter is found;

grouping said values according to said timebase into bins of a histogram corresponding to sub-intervals of said actual clock period; and analyzing said histogram to determine said characteristic of said clock signal.

16. A method of measuring an actual clock period of a clock signal under measurement, comprising:
- collecting samples of values of said clock signal under measurement at regular intervals having a sampling period differing from said actual clock period of said clock signal or a multiple thereof, wherein said collecting is performed using a reference clock having a known sampling period;
- determining a timebase period corresponding to a relationship between said sampling period and said actual clock period;
- grouping said values according to said timebase into bins of a histogram corresponding to sub-intervals of said actual clock period; and
- analyzing said histogram to determine said actual clock period of said clock signal by calculating said actual clock period from said timebase period.

17. A workstation computer system comprising a processor for executing program instructions coupled to a memory for storing program instructions and data, wherein said program instructions comprise program instructions for measuring an actual clock period of a clock signal under measurement, said program instructions comprising program instructions for:
- collecting samples of values of said clock signal under measurement at regular intervals having a sampling period differing from said actual clock period of said clock signal or a multiple thereof, wherein said collecting samples is performed using a reference clock having a known sampling period;
- determining a timebase period corresponding to a relationship between said sampling period and said actual clock period;
- grouping said values according to said timebase into bins of a histogram corresponding to sub-intervals of said actual clock period; and
- analyzing said histogram to determine said actual clock period of said clock signal by calculating said actual clock period from said timebase period yielding said minimum amount of effective jitter.

* * * * *